(12) United States Patent
Song (10) Patent No.: US 10,147,476 B2
(45) Date of Patent: Dec. 4, 2018

(54) SEMICONDUCTOR DEVICE, SEMICONDUCTOR SYSTEM WITH THE SEMICONDUCTOR DEVICE AND METHOD OF DRIVING THE SEMICONDUCTOR SYSTEM CAPABLE OF PERFORMING REFRESH OPERATIONS IN UNITS OF GROUPS OF SEMICONDUCTOR DEVICES

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/709,143

(22) Filed: May 11, 2015

(65) Prior Publication Data

US 2016/0180912 A1     Jun. 23, 2016

(30) Foreign Application Priority Data

Dec. 19, 2014  (KR) ............... 10-2014-00184279

(51) Int. Cl.
*G11C 11/406*    (2006.01)
*G11C 11/4074*   (2006.01)

(52) U.S. Cl.
CPC ... *G11C 11/40618* (2013.01); *G11C 11/40611* (2013.01); *G11C 11/4074* (2013.01); *G11C 2211/4063* (2013.01)

(58) Field of Classification Search
CPC .............. G11C 11/406; G11C 11/4074; G11C 11/40618; G11C 11/40611

USPC .................................................. 365/191, 222
See application file for complete search history.

(56) References Cited

U.S. PATENT DOCUMENTS

| | | | | |
|---|---|---|---|---|
| 2008/0049532 A1* | 2/2008 | Kajigaya | ................. | G11C 8/12 365/222 |
| 2012/0307582 A1* | 12/2012 | Marumoto | ........ | G11C 11/40615 365/222 |
| 2013/0272082 A1* | 10/2013 | Kim | ...................... | G11C 11/402 365/203 |
| 2014/0064009 A1* | 3/2014 | Lee | ................... | G11C 11/40611 365/222 |
| 2014/0085999 A1* | 3/2014 | Kang | .................. | G11C 29/023 365/222 |
| 2014/0192606 A1* | 7/2014 | Kang | ............... | G11C 11/40611 365/222 |

FOREIGN PATENT DOCUMENTS

KR       1020140089982         7/2014

* cited by examiner

*Primary Examiner* — Alexander Sofocleous
*Assistant Examiner* — Alfredo Bermudez Lozada
(74) *Attorney, Agent, or Firm* — IP & T Group LLP (57) ABSTRACT

A semiconductor device includes a first control block suitable for selectively blocking a refresh command signal based on a period signal having a predetermined activating pattern and a predetermined mode signal activated in a predetermined mode to generate a refresh group signal; and a second control block suitable for controlling a refresh operation based on the refresh group signal.

18 Claims, 7 Drawing Sheets

SEMICONDUCTOR DEVICE, SEMICONDUCTOR SYSTEM WITH THE SEMICONDUCTOR DEVICE AND METHOD OF DRIVING THE SEMICONDUCTOR SYSTEM CAPABLE OF PERFORMING REFRESH OPERATIONS IN UNITS OF GROUPS OF SEMICONDUCTOR DEVICES

CROSS-REFERENCE TO RELATED APPLICATIONS

The present application claims priority of Korean Patent Application No. 10-2014-00184279, filed on Dec. 19, 2014, which is incorporated herein by reference in its entirety.

BACKGROUND

1. Field

Various embodiments of the present invention relate to a semiconductor design technology and, more particularly, to a semiconductor device, a semiconductor system with the semiconductor device and a method of driving the semiconductor system.

2. Description of the Related Art

Figure 1:
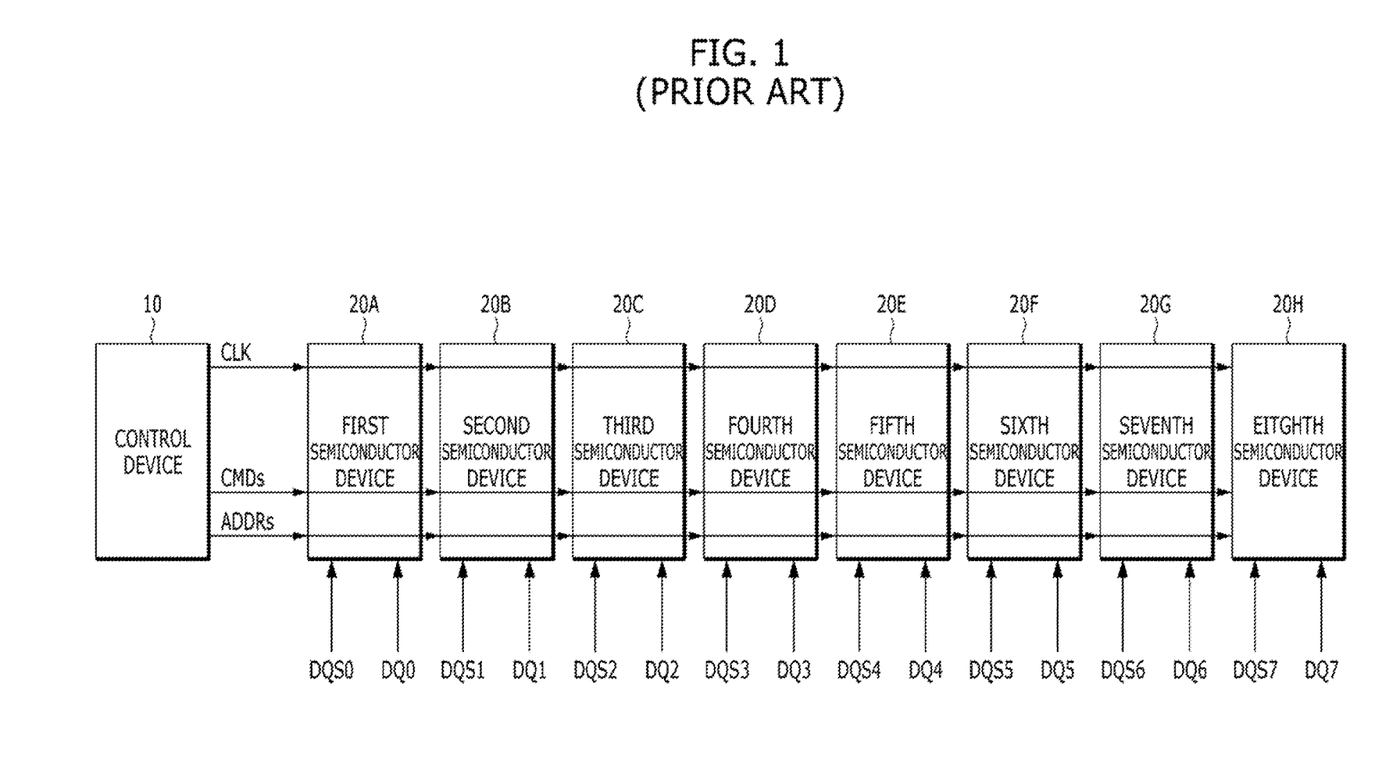
FIG. 1 is a block diagram illustrating a conventional semiconductor system.

FIG. 1 is a block diagram illustrating a conventional semiconductor system.

Referring to FIG. 1, the conventional semiconductor system includes a control device 10 and first to eighth semiconductor devices 20A to 20H. The control device 10 generates a clock signal CLK, command signals CMDs, address signals ADDRs, first to eighth data strobe signals DQS0 to DQS7 and first to eighth data signals DQ0 to DQ7. The first to eighth semiconductor devices 20A to 20H perform predetermined operations based on the dock signal CLK, the command signals CMDs, the address signals ADDRs, the first to eighth data strobe signals DQS0 to DQS7 and the first to eighth data signals DQ0 to DQ7. The first to eighth semiconductor devices 20A to 20H share the clock signal CLK, the command signals CMDs, and the address signals ADDRs, and separately receive the respective first to eighth data strobe signals DQS0 to DQS7 and the respective first to eighth data signals DQ0 to DQ7.

The control device 10 controls the predetermined operations of the first to eighth semiconductor devices 20A to 20H. For example, the control device 10 controls refresh operations and data input/output operations of the first to eighth semiconductor devices 20A to 20H. For reference, a refresh operation denotes an operation in which memory cells included in a semiconductor device are read and updated (or rewritten) with amplified data.

The first to eighth semiconductor devices 20A to 20H perform the predetermined operations under the control of the control device 10. For example, the first to eighth semiconductor devices 20A to 20H perform the refresh operations at the same time in response to the clock signal CLK and the command signals CMDs and individually perform the data input/output operations in response to the clock signal CLK, the command signals CMDs, the address signals ADDRs, the respective data strobe signals DQS0 to DQS7 and the respective data signals DQ0 to DQ7.

Figure 2:
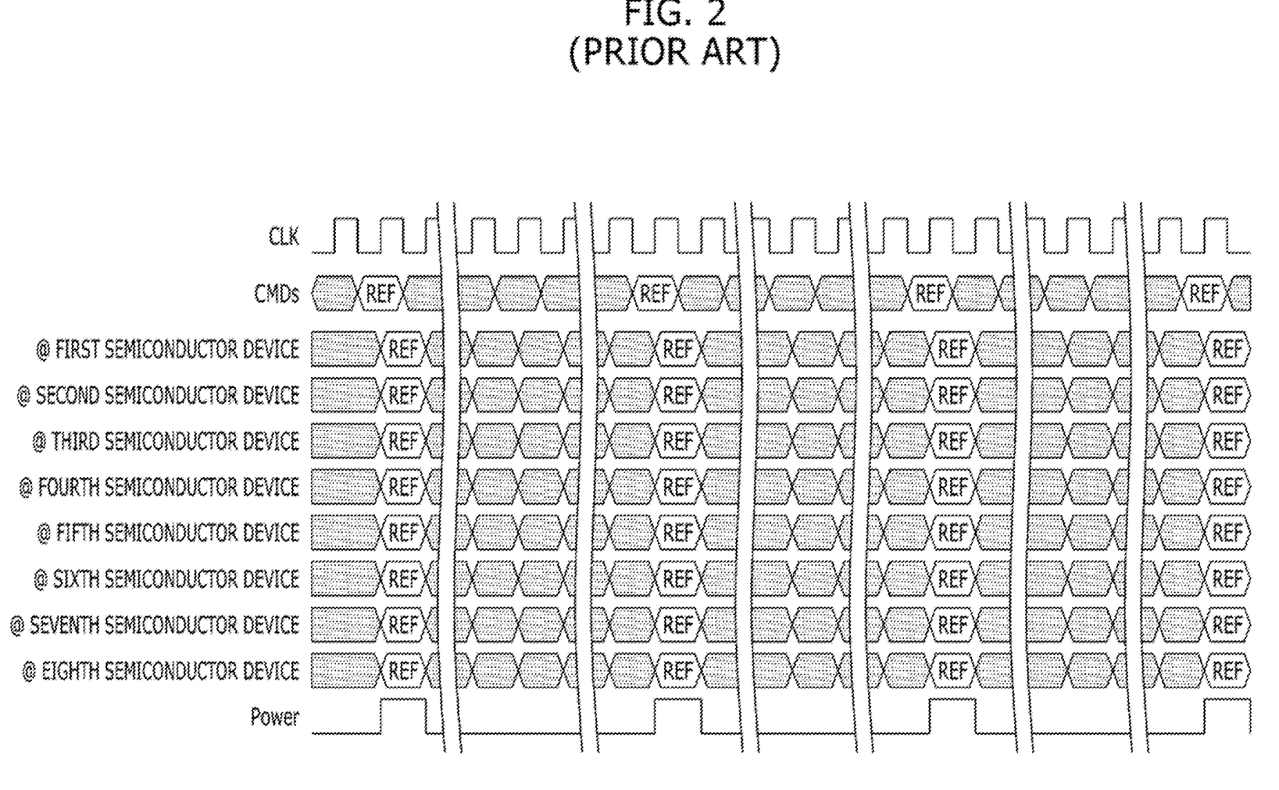
FIG. 2 is a timing diagram for describing an operation of conventional semiconductor system shown in FIG. 1.

FIG. 2 is a timing diagram for describing an operation of the conventional semiconductor system shown in FIG. 1.

Referring to FIG. 2, the control device 10 sequentially generates the command signals CMDs corresponding to a refresh command signal REF at a predetermined cycle. Then, the first to eighth semiconductor devices 20A to 20H perform the refresh operations at the same time whenever the refresh command signal REF is applied. This causes considerable current consumption in the first to eighth semiconductor devices 20A to 20H, and the current consumption results in power noise. The more semiconductor devices included in the semiconductor system, the more serious the power noise becomes. In other words, as the density of integration of the semiconductor devices increases the power noise may become a more serious concern.

Therefore, technology for decreasing the power noise occurring when the first to eighth semiconductor devices 20A to 20H simultaneously perform the refresh operations is in demand.

SUMMARY

Various embodiments of the present invention are directed to a semiconductor device, a semiconductor system with the semiconductor device, and a method of driving the semiconductor system, capable of performing refresh operations in units of groups of semiconductor devices.

In accordance with an embodiment of the present invention, a semiconductor device may include: a first control block suitable for selectively blocking a refresh command signal based on a period signal having a predetermined activating pattern and a predetermined mode signal activated in a predetermined mode to generate a refresh group signal; and a second control block suitable for controlling a refresh operation based on the refresh group signal.

The semiconductor device may further include: a common input block suitable for generating the period signal based on a first external signal during a refresh operation period and generating a predetermined signal based on a second external signal during a normal operation period, other than the refresh operation period.

The first external signal includes a pattern signal having the predetermined activating pattern, and the second external signal includes a write data signal.

In accordance with an embodiment of the present invention, a semiconductor system may include: a control device suitable for generating a refresh control signal at a predetermined cycle, a first pattern signal having a first activating pattern and a second pattern signal having a second activating pattern, which is different from the first activating pattern, during a refresh operation period; one or more first semiconductor devices suitable for performing refresh operations every first activating duration corresponding to the first activating pattern based on the refresh control signal and the first pattern signal, during the refresh operation period; and one or more second semiconductor devices suitable for performing the refresh operations every second activating duration corresponding to the second activating pattern based on the refresh control signal and the second pattern signal, during the refresh operation period.

The control device may generate a predetermined mode control signal, and when the predetermined mode control signal is activated, the control device generates the refresh control signal at a first cycle and the first and second pattern signals having different activating durations, and when the predetermined mode control signal is deactivated, the control device may generate the refresh control signal at a second cycle, which is different from the first cycle, and the first and second pattern signals having a uniform logic level.

The first semiconductor device may include: a first input block suitable for generating a refresh command signal and a predetermined mode signal based on the refresh control signal and the predetermined mode control signal; a second input block suitable for generating a first cycle signal based on the first pattern signal; a first refresh control block suitable for selectively blocking the refresh command signal based on the predetermined mode signal and the first cycle signal to generate a first refresh group signal; and a second refresh control block suitable for controlling the refresh operation based on the first refresh group signal.

The first input block may include: a command decoding unit suitable for generating the refresh command signal and a predetermined mode command signal by decoding the refresh control signal and the predetermined mode control signal; an address input unit suitable for receiving one or more address signals inputted from the control device; and a mode signal generation unit suitable for generating the predetermined mode signal based on the predetermined mode command signal and an output signal of the address input unit.

The mode signal generation unit may include a mode register set (MRS).

The second input block may receive the first pattern signal during the refresh operation period, and may receive a predetermined first signal from the control device during a normal operation period, other than the refresh operation period.

The predetermined first signal includes a first write data signal.

The first refresh control block may include: a first control unit suitable for generating a first cycle control signal based on the first cycle signal and the predetermined mode signal; and a second control unit suitable for selectively blocking the refresh command signal based on the first cycle control signal to generate the first refresh group signal.

The second semiconductor device may include: a first input block suitable for generating a refresh command signal and a predetermined mode signal based on the refresh control signal and the predetermined mode control signal; a second input block suitable for generating a second cycle signal based on the second pattern signal; a first refresh control block suitable for selectively blocking the refresh command signal based on the predetermined mode signal and the second cycle signal to generate a second refresh group signal; and a second refresh control block suitable for controlling the refresh operation based on the second refresh group signal.

The first input block may include: a command decoding unit suitable for generating the refresh command signal and a predetermined mode command signal by decoding the refresh control signal and the predetermined mode control signal; an address input unit suitable for receiving one or more address signals inputted from the control device; and a mode signal generation unit suitable for generating the predetermined mode signal based on the predetermined mode command signal and an output signal of the address input unit.

The mode signal generation unit may include a mode register set (MRS).

The second input block may receive the second pattern signal during the refresh operation period, and receives a predetermined second signal from the control device during a normal operation period, other than the refresh operation period.

The predetermined second signal may include a second write data signal.

The first refresh control block may include: a first control unit suitable for generating a second cycle control signal based on the second cycle signal and the predetermined mode signal; and a second control unit suitable for selec-tively blocking the refresh command signal based on the second cycle control signal to generate the second refresh group signal.

The first cycle may be shorter than the second cycle.

In accordance with an embodiment of the present invention, a method of driving a semiconductor system with a control device and a plurality of semiconductor devices includes: entering, by the control device, a power saving mode; generating, by the control device, a refresh control signal at a first cycle, a predetermined mode control signal activated corresponding to the power saving mode, and first and second pattern signals alternately activated corresponding to the first cycle; and alternately performing refresh operations on one or more first semiconductor devices and one or more second semiconductor devices of the semiconductor devices, wherein the one or more first semiconductor devices receive the refresh control signal, the predetermined mode control signal and the first pattern signal, and the one or more second semiconductor devices receive the refresh control signal, the predetermined mode control signal and the second pattern signal.

The method may further include: exiting, by the control device, from the power saving mode; generating, by the control device, the refresh control signal at a second cycle that is longer than the first cycle, the predetermined mode control signal deactivated corresponding to the power saving mode, and the first and second pattern signals having a uniform logic level; and simultaneously performing the refresh operations on the first and second semiconductor devices.

DETAILED DESCRIPTION

Exemplary embodiments of the present invention are described below in detail with reference to the accompanying drawings. These embodiments are provided so that this disclosure is thorough and complete, and fully conveys the scope of the present invention to those skilled in the art.

Throughout the disclosure, like reference numerals refer to like parts in the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

In the following embodiments of the present invention, a semiconductor system in which first to eighth semiconductor devices operate under the control of a single control device is described as an example.

In the following embodiments of the present invention, a first semiconductor device, a third semiconductor device, a fifth semiconductor device and a seventh semiconductor device are referred to as a first group, and a second semiconductor device, a fourth semiconductor device, a sixth semiconductor device and a eighth semiconductor device are referred to as a second group.

Figure 3:
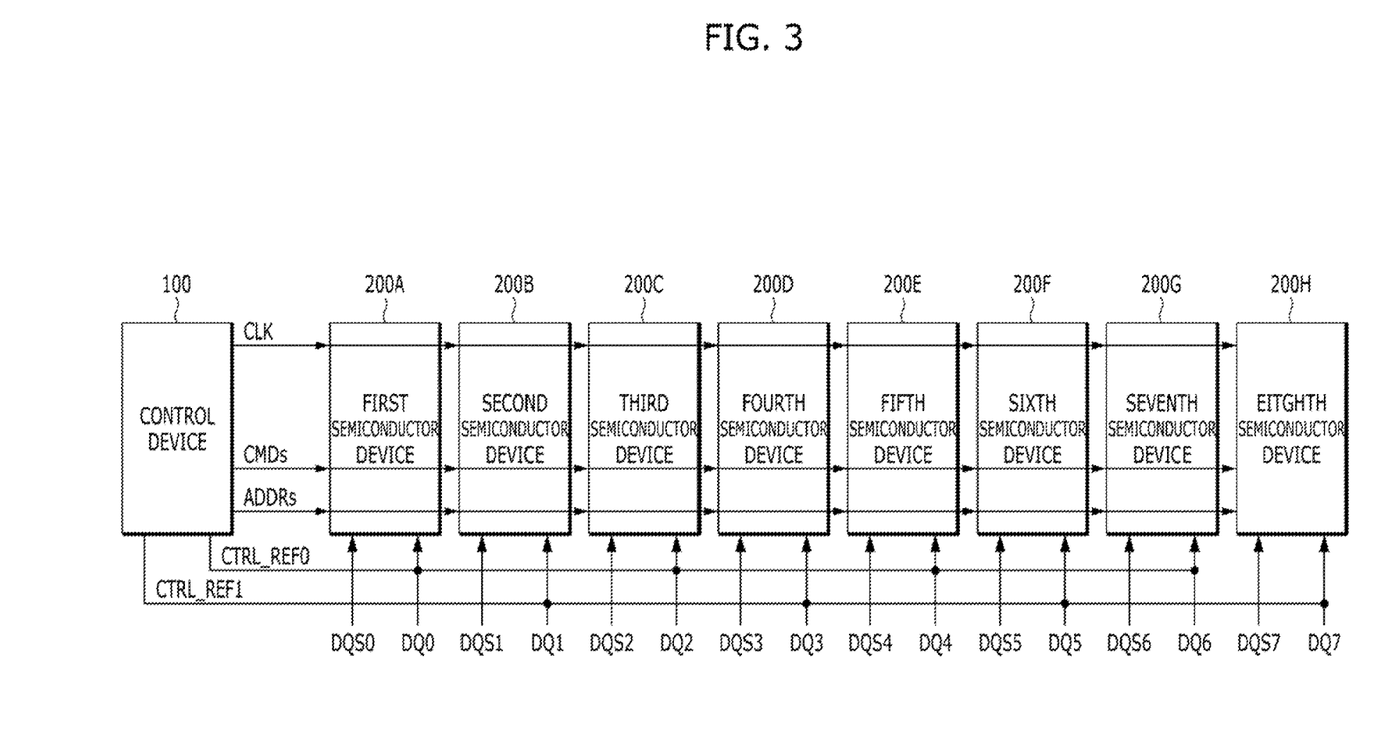
FIG. 3 is a block diagram illustrating a semiconductor system in accordance with an embodiment of the present invention.

FIG. 3 is a block diagram illustrating a semiconductor system in accordance with an embodiment of the present invention.

Referring to FIG. 3, the semiconductor system may include a control device 100 and first to eighth semiconductor devices 200A to 200H. The control device 100 generates a clock signal CLK, command signals CMDs, address signals ADDRs, first and second pattern signals CTRL_REF0 and CTRL_REF1, first to eighth data strobe signals DQS0 to DQS7 and first to eighth data signals DQ0 to DQ7. The first to eighth semiconductor devices 200A to 200H perform predetermined operations based on the clock signal CLK, the command signals CMDs, the address signals ADDRs, the respective first to eighth data strobe signals DQS0 to DQS7 and the respective first to eighth data signals DQ0 to DQ7.

The control device 100 may control the predetermined operations of the first to eighth semiconductor devices 200A to 200H. For example, the control device 100 may control refresh operations of the first to eighth semiconductor devices 200A to 200H during a refresh operation period and data input/output operations of the first to eighth semiconductor devices 200A to 200H during a normal operation period other than the refresh operation period. For reference, the refresh operation denotes an operation in which memory cells included in the semiconductor device are read and updated (or rewritten) with amplified data. Hereinafter, a description focusing on the refresh operations is provided.

The control device 100 may generate the command signals CMDs and the address signals ADDRs corresponding to predetermined mode control signals before the refresh operation period. The control device 100 may generate the command signals CMDs corresponding to refresh control signals at a predetermined cycle, the first pattern signal CTRL_REF0 having a first activating pattern and the second pattern signal CTRL_REF1 having a second activating pattern during the refresh operation period.

For example, when the command signals CMDs and the address signals ADDRs are generated so that the predetermined mode control signals are activated before the refresh operation period, the control device 100 may generate the command signals CMDs corresponding to the refresh control signals at a first cycle and the first and second pattern signals CTRL_REF0 and CTRL_REF1 having the first and second activating patterns which are different from each other during the refresh operation period. When the command signals CMDs and the address signals ADDRs are generated so that the predetermined mode control signals are deactivated before the refresh operation period, the control device 100 may generate the command signals CMDs corresponding to the refresh control signals at a second cycle which is different from the first cycle and the first and second pattern signals CTRL_REF0 and CTRL_REF1 having uniform logic levels during the refresh operation period.

The first to eighth semiconductor devices 200A to 200H perform the predetermined operations under the control of the control device 100. For example, the first to eighth semiconductor devices 200A to 200H may perform the refresh operations by group in response to the clock signal CLK, the command signals CMDs and the first and second pattern signals CTRL_REF0 and CTRL_REF1 and individually perform the data input/output operations in response to the clock signal CLK, the command signals CMDs, the address signals ADDRs, each of the first to eighth data strobe signals DQS0 to DQS7 and each of the first to eighth data signals DQ0 to DQ7.

Herein, the semiconductor devices 200A, 200C, 200E and 200G of the first group may receive the first pattern signal CTRL_REF0, and the semiconductor devices 200B, 200D, 200F and 200H of the second group may receive the second pattern signal CTRL_REF1. The first to eighth semiconductor devices 200A to 200H may receive the first pattern signal CTRL_REF0 or the second pattern signal CTRL_REF1 through a path for receiving each of the first to eighth data signals DQ0 to DQ7. This is because each of the first to eighth data signals DQ0 to DQ7 is not inputted during the refresh operation period. Therefore, the pattern signal and the data signals may be inputted through a single path. Although it is described in the embodiment of the present invention that the first pattern signal CTRL_REF0 or the second pattern signal CTRL_REF1 is inputted sharing the path where each of the first to eighth data signals DQ0 to DQ7 is inputted, the inventive concept is not limited this, and another input path which is not used during the refresh operation period may be used. In addition, exclusive paths for each of the first pattern signal CTRL_REF0 and the second pattern signal CTRL_REF1 may be formed.

Figure 4:
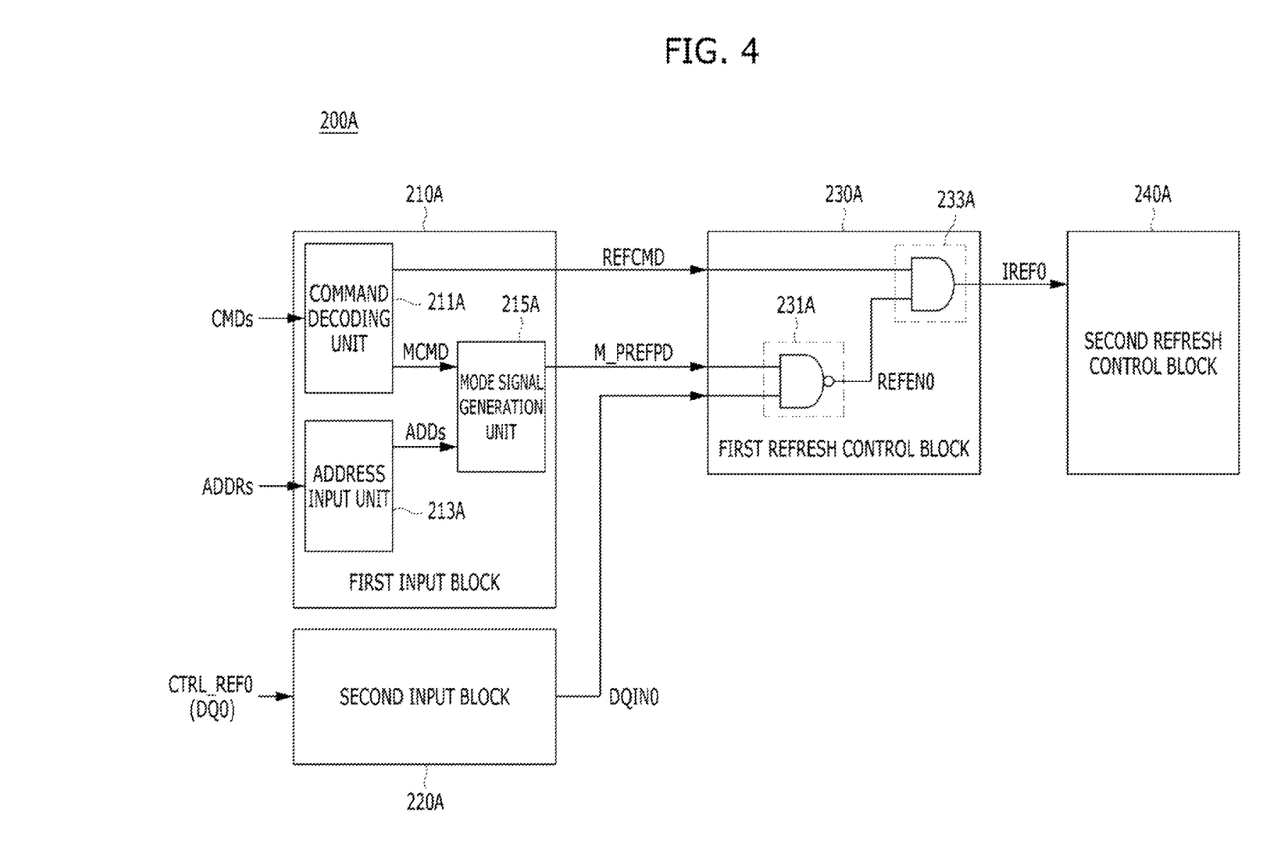
FIG. 4 is a detailed diagram of a first semiconductor device shown in FIG. 3.

FIG. 4 is a detailed diagram of the first semiconductor device 200A shown in FIG. 3.

Referring to FIG. 4, the first semiconductor device 200A may include a first input block 210A, a second input block 220A, a first refresh control block 230A and a second refresh control block 240A. The first input block 210A generates a predetermined mode signal M_PREFPD and a refresh command signal REFCMD in response to the command signals CMDs including the predetermined mode control signal and the refresh control signal. The second input block 220A generates a first cycle signal DQIN0 corresponding to the first pattern signal CTRL_REF0. The first refresh control block 230A selectively transfers (or blocks) the refresh command signal REFCMD in response to the predetermined mode signal M_PREFPD and the first cycle signal DQIN0. The second refresh control block 240A controls the refresh operation in response to a first refresh group signal IREF0 outputted from the first refresh control block 230A.

The first input block 210A may include a command decoding unit 211A, an address input unit 213A and a mode signal generation unit 215A. The command decoding unit 211A decodes the command signals CMDs and generates the refresh command signal REFCMD and a predetermined mode command signal MCMD. The address input unit 213A receives the address signals ADDRs. The mode signal generation unit 215A generates the predetermined mode signal M_PREFPD in response to the predetermined mode command signal MCMD and an output signal ADDs of the address input unit 213A. Herein, the mode signal generation unit 215A may include a mode register set (MRS).

The second input block 220A may transmit the first pattern signal CTRL_REF0 as the first cycle signal DQIN0 to the first refresh control block 230A during the refresh operation period and the first data signal DQ0 to a predetermined internal circuit block (not shown) during the normal operation period.

The first refresh control block 230A may include a first control unit 231A and a second control unit 233A. The first control unit 231A generates a first cycle control signal REFEN0 in response to the first cycle signal DQIN0 and the predetermined mode signal M_PREFPD. The second control unit 233A selectively transfers the refresh command signal REFCMD in response to the first cycle control signal REFEN0 to generate the first refresh group signal IREF0. For example, the first control unit 231A may include a NAND gate for outputting the first cycle control signal REFEN0 by performing a NAND operation on the predetermined mode signal M_PREFPD and the first cycle signal DQIN0, and the second control unit 233A may include an AND gate for outputting the first refresh group signal IREF0 by performing an AND operation on the first cycle control signal REFEN0 and the refresh command signal REFCMD.

Since the third semiconductor device 200C, the fifth semiconductor device 200E and the seventh semiconductor device 200G have the same structure as the first semiconductor device 200A, a detailed description thereon is omitted herein.

Figure 5:
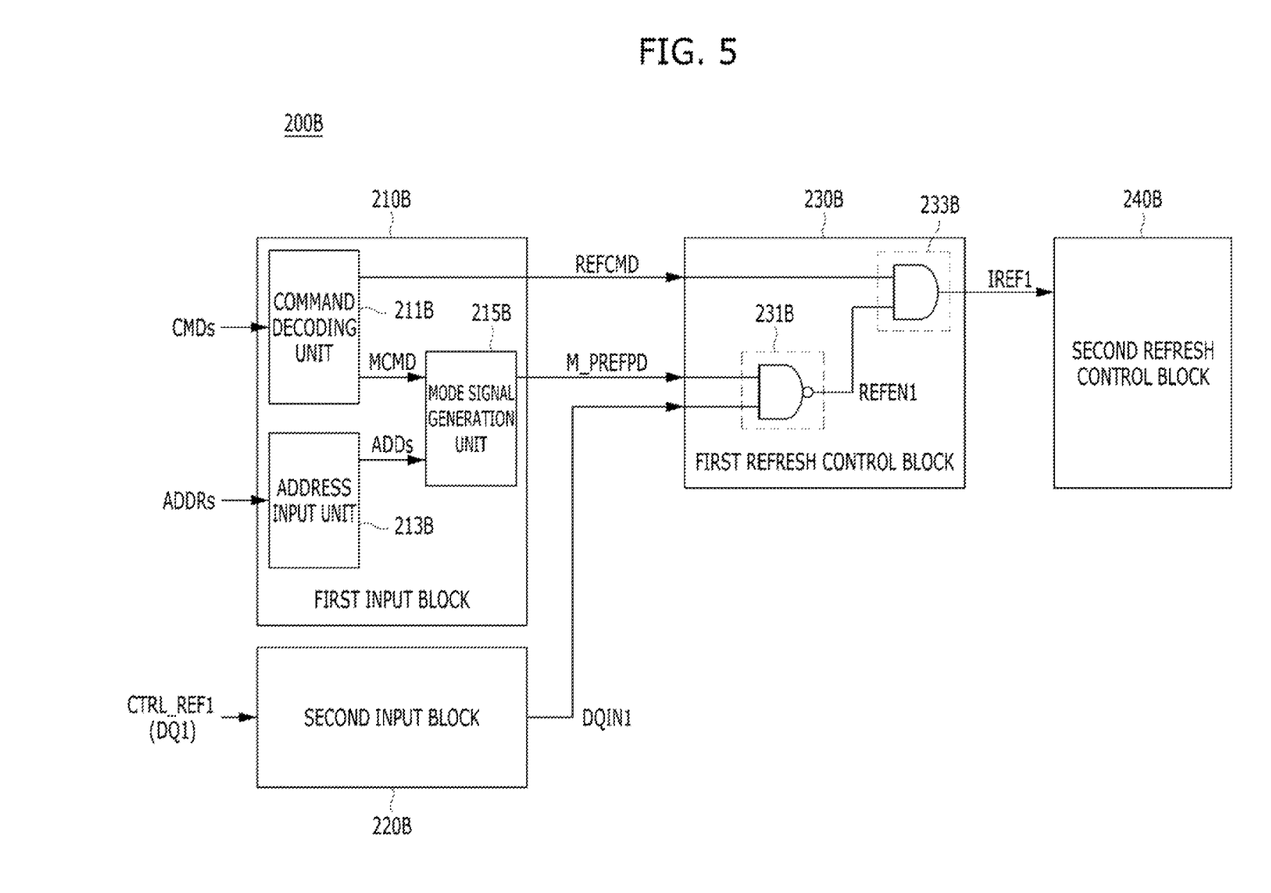
FIG. 5 is a detailed diagram of a second semiconductor device shown in FIG. 3.

FIG. 5 is a detailed diagram of the second semiconductor device 200B shown in FIG. 3.

Referring to FIG. 5, the second semiconductor device 200B may include a first input block 210B, a second input block 220B, a first refresh control block 230B and a second refresh control block 240B. The first input block 210B generates a predetermined mode signal M_PREFPD and a refresh command signal REFCMD in response to the command signals CMDs including the predetermined mode control signal and the refresh control signal. The second input block 220B generates a second cycle signal DQIN1 corresponding to the second pattern signal CTRL_REF1. The first refresh control block 230B selectively transfers (or blocks) the refresh command signal REFCMD in response to the predetermined mode signal M_PREFPD and the second cycle signal DQIN1. The second refresh control block 240B controls the refresh operation in response to a second refresh group signal IREF1 outputted from the first refresh control block 230B.

The first input block 210B may include a command decoding unit 211B, an address input unit 213B and a mode signal generation unit 215B. The command decoding unit 211B decodes the command signals CMDs and generates the refresh command signal REFCMD and a predetermined mode command signal MCMD. The address input unit 213B receives the address signals ADDRs. The mode signal generation unit 215B generates the predetermined mode signal M_PREFPD in response to the predetermined mode command signal MCMD and an output signal ADDs of the address input unit 213B. Herein, the mode signal generation unit 215B may include a mode register set (MRS).

The second input block 220B may transmit the second pattern signal CTRL_REF1 as the second cycle signal DQIN1 to the first refresh control block 230B during the refresh operation period and the second data signal DQ1 to a predetermined internal circuit block (not shown) during the normal operation period.

The first refresh control block 230B may include a first control unit 231B and a second control unit 233B. The first control unit 231B generates a second cycle control signal REFEN1 in response to the second cycle signal DQIN1 and the predetermined mode signal M_PREFPD. The second control unit 233B selectively transfers the refresh command signal REFCMD in response to the second cycle control signal REFEN1 to generate the second refresh group signal IREF1. For example, the first control unit 231B may include the NAND gate for outputting the second cycle control signal REFEN1 by performing a NAND operation on the predetermined mode signal M_PREFPD and the second cycle signal DQIN1, and the second control unit 233B may include the AND gate for outputting the second refresh group signal IREF1 by performing an AND operation on the second cycle control signal REFEN1 and the refresh command signal REFCMD.

Since the fourth semiconductor device 200D, the sixth semiconductor device 200F and the eighth semiconductor device 200B have the same structure as the second semiconductor device 200B, a detailed description thereon is omitted herein.

Hereinafter, a method of driving the semiconductor system having the aforementioned structure in accordance with the embodiments of the present invention is described with reference to FIGS. 6 and 7.

Figure 6:
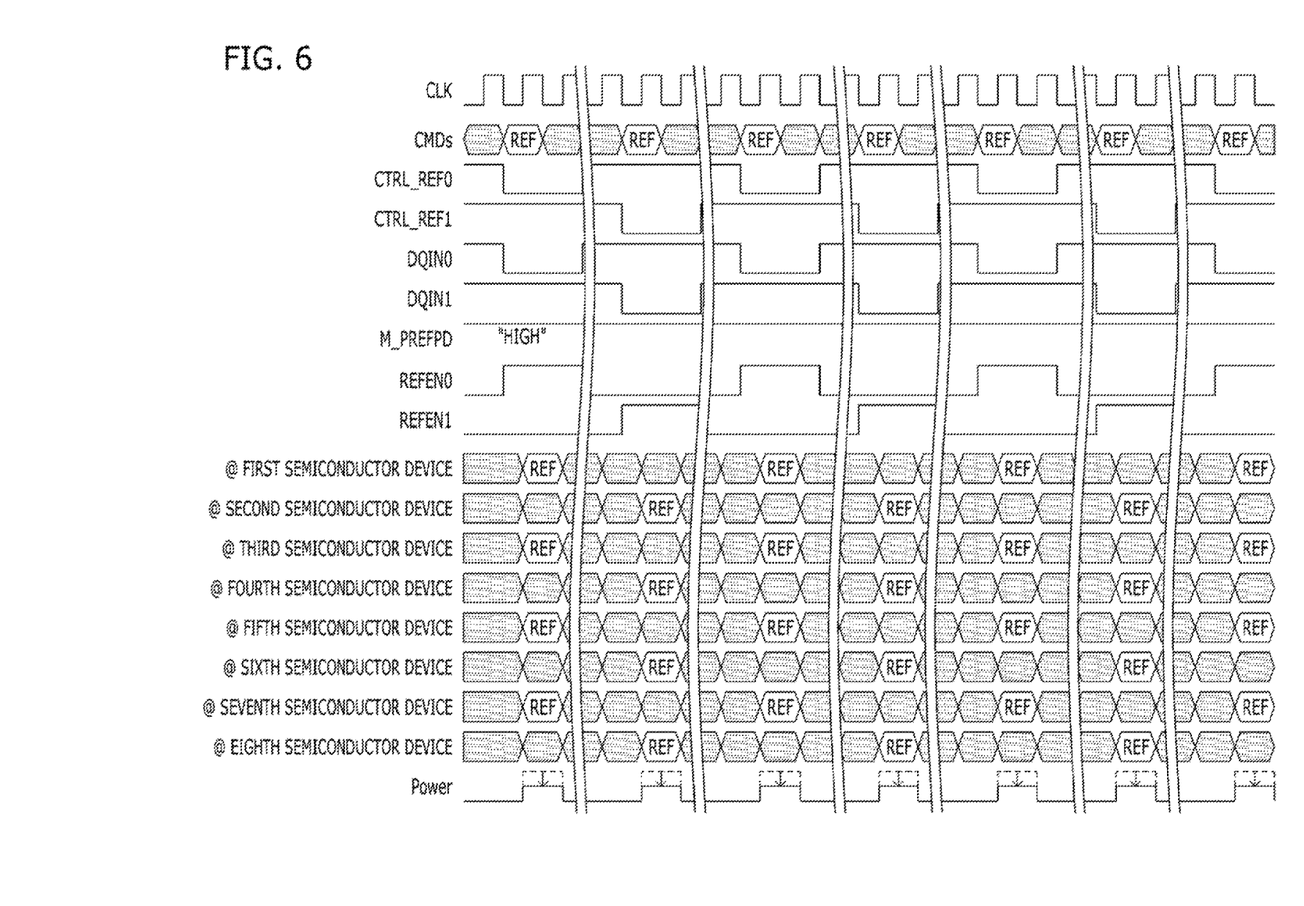
FIGS. 6 and 7 are timing diagrams for describing a refresh operation of the semiconductor system shown in FIG. 3.

FIG. 6 is a timing diagram for describing a refresh operation of the semiconductor system shown in FIG. 3 during a power saving mode.

Referring to FIG. 6, when the semiconductor system enters the power saving mode, the control device 100 may generate the predetermined mode control signals (not shown) corresponding to the power saving mode entry as the command signals CMDs. The first to eighth semiconductor devices 200A to 200H may sense whether the semiconductor system enters the power saving mode in response to the command signals CMDs. For example, the first input blocks 210A to 210H included in the first to eighth semiconductor devices 200A to 200H may activate the predetermined mode signal M_PREFPD to a logic high level in response to the command signals CMDs.

When the semiconductor system enters the power saving mode, the control device 100 may generate the command signals CMDs corresponding to a refresh control signal REF at a first cycle and the first and second pattern signals CTRL_REF0 and CTRL_REF1 which are alternately activated corresponding to the first cycle during the refresh operation period.

The semiconductor devices 200A 200C, 200E and 200G of the first group and the semiconductor devices 200B, 200D, 200F and 200H of the second group may alternately perform the refresh operations in response to the command signals CMDs and the first pattern signal CTRL_REF0 or the command signals CMDs and the second pattern signal CTRL_REF1 during the refresh operation period. For example, the semiconductor devices 200A, 200C, 200E and 200G of the first group may perform the refresh operations every odd-numbered period of the refresh control signal REF in response to the command signals CMDs and the first pattern signal CTRL_REF0 during the refresh operation period, and the semiconductor devices 200B, 200D, 200F and 200H of the second group may perform the refresh operations every even-numbered period of the refresh control signal REF in response to the command signals CMDs and the second pattern signal CTRL_REF1 during the refresh operation period.

Figure 7:
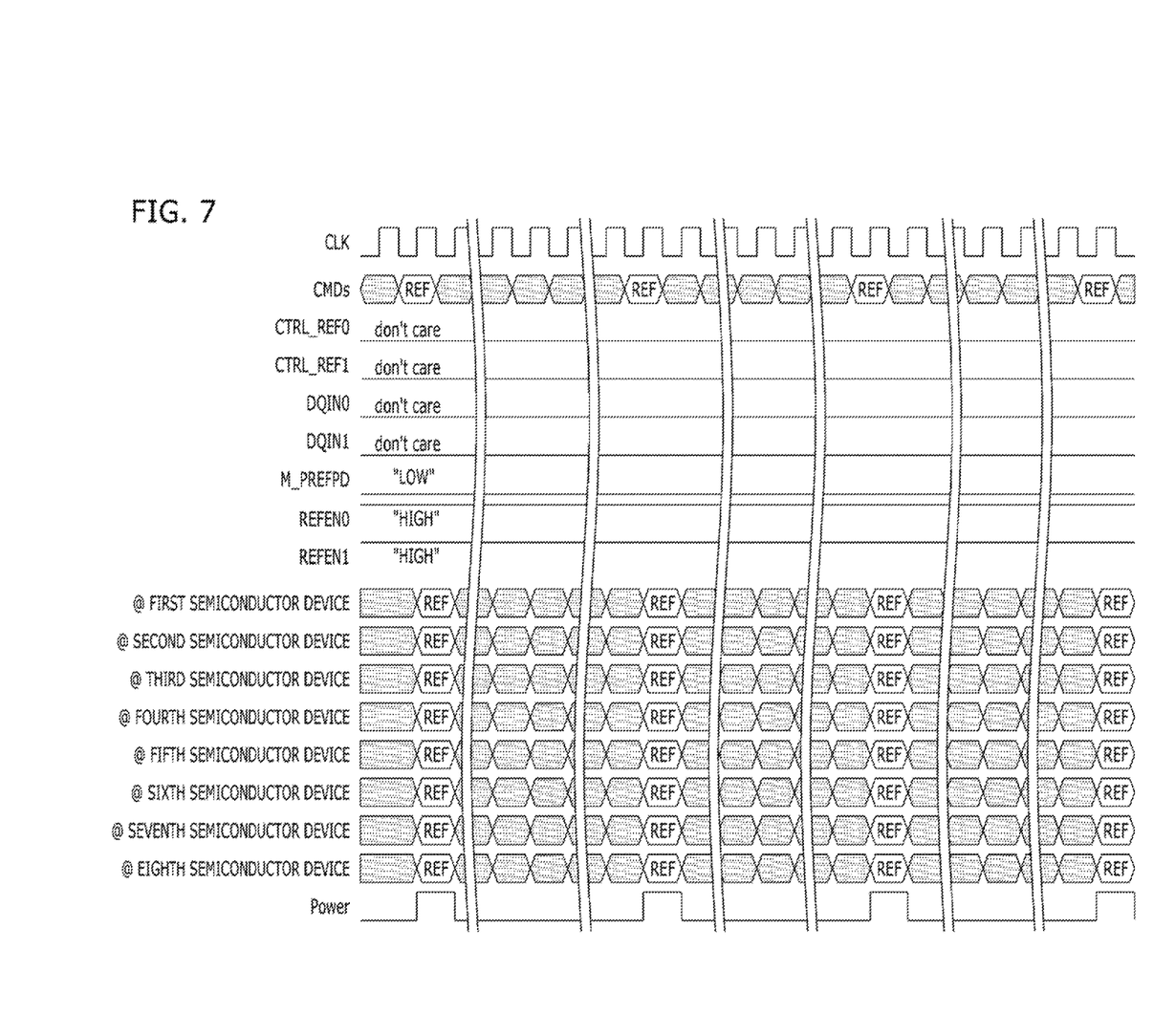

FIG. 7 is a timing diagram for describing a refresh operation of the semiconductor system shown in FIG. 3 outside a power saving mode.

The semiconductor system may exit from the power saving mode. The exit from the power saving mode means that the semiconductor system is not in the power saving mode.

Referring to FIG. 7, when the semiconductor system exits from the power saving mode, the control device 100 may generate the predetermined mode control signals (not shown) corresponding to the power saving mode exit as the command signals CMDs. The first to eighth semiconductor devices 200A to 200H may sense whether the semiconductor system exits from the power saving mode in response to the command signals CMDs. For example, the first input blocks 210A to 210H included in the first to eighth semiconductor devices 200A to 200H may deactivate the predetermined mode signal M_PREFPD to a logic low level in response to the command signals CMDs.

When the semiconductor system exits from the power saving mode, the control device 100 may generate the command signals CMDs corresponding to a refresh control signal REF at a second cycle which is two times longer than the first cycle and the first and second pattern signals CTRL_REF0 and CTRL_REF1 having uniform logic levels during the refresh operation period.

The semiconductor devices 200A, 200C, 200E and 200G of the first group and the semiconductor devices 200B, 200D, 200F and 200H of the second group may collectively perform the refresh operations in response to the command signals CMDs and the first pattern signal CTRL_REF0 or the command signals CMDs and the second pattern signal CTRL_REF1 during the refresh operation period.

It may be seen that the refresh operations outside the power saving mode are performed in the same manner as the general refresh operations.

In accordance with the embodiments of the present invention, the semiconductor devices of the first group and the semiconductor devices of the second group alternately perform the refresh operations in the power saving mode so that the current consumption may be dispersed.

In addition, as a plurality of semiconductor devices are divided into different groups, and the refresh operations are dispersed by group under the control of the control device, power noise may be reduced.

While the present invention has been described with respect to specific embodiments, the embodiments of the present invention are not intended to restrictive, but rather descriptive. Further, the present invention may be achieved in various ways through substitution, change, and modification, by those skilled in the art without departing from the scope of the present invention as defined by the following claims.

What is claimed is:

1. A semiconductor system, comprising:
a control device configured to generate a refresh control signal at a predetermined cycle, a first refresh pattern signal having a first refresh activating pattern and a second refresh pattern signal having a second refresh activating pattern which is different from the first refresh activating pattern, during a refresh operation period;
a first semiconductor group having first semiconductor devices configured to perform refresh operations every first refresh activating duration corresponding to the first refresh activating pattern based on the refresh control signal and the first refresh pattern signal, which are provided from the control device, during the refresh operation period; and
a second semiconductor group having second semiconductor devices configured to perform the refresh operations every second refresh activating duration corresponding to the second refresh activating pattern based on the refresh control signal and the second refresh pattern signal, which are provided from the control device, during the refresh operation period, wherein the first semiconductor devices receive the first refresh pattern signal from the control device through a first data signal input path, and the second semiconductor devices receive the second refresh pattern signal from the control device through a second data signal input path,
wherein each of the first semiconductor devices includes:
a first input block configured to generate a refresh command signal and a predetermined mode signal based on the refresh control signal and a predetermined mode control signal;
a second input block configured to generate a first cycle signal based on the first refresh pattern signal;
a first refresh control block configured to selectively block the refresh command signal based on the predetermined mode signal and the first cycle signal to generate a first refresh group signal; and
a second refresh control block configured to control the refresh operation based on the first refresh group signal.

2. The semiconductor system of claim 1, wherein the control device generates the predetermined mode control signal, and
when the predetermined mode control signal is activated, the control device generates the refresh control signal at a first cycle and the first and second refresh pattern signals having different refresh activating durations, and
when the predetermined mode control signal is deactivated, the control device generates the refresh control signal at a second cycle, which is different from the first cycle, and the first and second refresh pattern signals having a uniform logic level.

3. The semiconductor system of claim 2, wherein the first input block includes:
a command decoding unit configured to generate the refresh command signal and a predetermined mode command signal by decoding the refresh control signal and the predetermined mode control signal;
an address input unit configured to receive one or more address signals inputted from the control device; and
a mode signal generation unit configured to generate the predetermined mode signal based on the predetermined mode command signal and an output signal of the address input unit.

4. The semiconductor system of claim 3, wherein the mode signal generation unit includes a mode register set (MRS).

5. The semiconductor system of claim 2, wherein each of the second semiconductor devices includes:
a first input block configured to generate a refresh command signal and a predetermined mode signal based on the refresh control signal and the predetermined mode control signal;
a second input block configured to generate a second cycle signal based on the second refresh pattern signal;
a first refresh control block configured to selectively block the refresh command signal based on the predetermined mode signal and the second cycle signal to generate a second refresh group signal; and
a second refresh control block configured to control the refresh operation based on the second refresh group signal.

6. The semiconductor system of claim 5, wherein the first input block includes:
a command decoding unit configured to generate the refresh command signal and a predetermined mode command signal by decoding the refresh control signal and the predetermined mode control signal;

an address input unit configured to receive one or more address signals inputted from the control device; and a mode signal generation unit configured to generate the predetermined mode signal based on the predetermined mode command signal and an output signal of the address input unit.

7. The semiconductor system of claim 6, wherein the mode signal generation unit includes a mode register set (MRS).

8. The semiconductor system of claim 5, wherein the second input block receives the second refresh pattern signal during the refresh operation period, and receives a predetermined second signal from the control device during a normal operation period, other than the refresh operation period.

9. The semiconductor system of claim 8, wherein the predetermined second signal includes a second write data signal.

10. The semiconductor system of claim 5, wherein the first refresh control block includes:

a first control unit configured to generate a second cycle control signal based on the second cycle signal and the predetermined mode signal; and a second control unit configured to selectively block the refresh command signal based on the second cycle control signal to generate the second refresh group signal.

11. The semiconductor system of claim 2, wherein the first cycle is shorter than the second cycle.

12. The semiconductor system of claim 1, wherein the second input block receives the first refresh pattern signal during the refresh operation period, and receives a predetermined first signal from the control device during a normal operation period, other than the refresh operation period.

13. The semiconductor system of claim 12, wherein the predetermined first signal includes a first write data signal.

14. The semiconductor system of claim 1, wherein the first refresh control block includes:

a first control unit configured to generate a first cycle control signal based on the first cycle signal and the predetermined mode signal; and a second control unit configured to selectively block the refresh command signal based on the first cycle control signal to generate the first refresh group signal.

15. The semiconductor system of claim 1, wherein:

when the predetermined mode control signal is activated, the control device generates the refresh control signal at a first cycle and the first and second refresh pattern signals having different refresh activating durations, and when the predetermined mode control signal is deactivated, the control device generates the refresh control signal at a second cycle, which is different from the first cycle, and the first and second refresh pattern signals having a uniform logic level.

16. The semiconductor system of claim 1, wherein the first input block deactivate the predetermined mode signal to a logic low level in response to command signals.

17. The semiconductor system of claim 1, wherein the first data signal input path is a first path for receiving a first data signal, and the first data signal input path is shared by the first data signal and the first refresh pattern signal.

18. The semiconductor system of claim 1, wherein the second data signal input path is a second path for receiving a second data signal, and the second data signal input path is shared by the second data signal and the second refresh pattern signal.

* * * * *